United States Patent
Kawai et al.

(10) Patent No.: US 6,579,818 B2
(45) Date of Patent: Jun. 17, 2003

(54) GLASS CERAMIC SINTERED PRODUCT

(75) Inventors: Shinya Kawai, Kokubu (JP); Masanari Kokubu, Kokubu (JP); Yoshitake Terashi, Kokubu (JP)

(73) Assignee: Kyocera Corporation, Kyoto (JP)

(*) Notice: Subject to any disclaimer, the term of this patent is extended or adjusted under 35 U.S.C. 154(b) by 68 days.

(21) Appl. No.: 09/942,089

(22) Filed: Aug. 28, 2001

(65) Prior Publication Data

US 2002/0094929 A1 Jul. 18, 2002

(30) Foreign Application Priority Data

Aug. 28, 2000 (JP) .......................... 2000-258021
Aug. 30, 2000 (JP) .......................... 2000-261827
Oct. 31, 2000 (JP) .......................... 2000-332658
May 24, 2001 (JP) .......................... 2001-155499

(51) Int. Cl.$^7$ .................. C03C 14/00; C03C 10/06; C03C 10/02
(52) U.S. Cl. .................. 501/32; 501/8; 501/10; 428/433; 428/434
(58) Field of Search ................... 501/8, 10, 32; 428/433, 434

(56) References Cited

U.S. PATENT DOCUMENTS 6,348,427 B1 * 2/2002 Hamada et al. .............. 501/32

FOREIGN PATENT DOCUMENTS

JP 6-171981 * 6/1994

* cited by examiner

Primary Examiner—Karl Group
(74) Attorney, Agent, or Firm—Hogan & Hartson, LLP

(57) ABSTRACT

Disclosed is a glass ceramic sintered product which contains as crystal phases:

(i) a gahnite crystal phase;
(ii) a celsian crystal phase containing needle-like crystals having an aspect ratio of not smaller than 3; and
(iii) at least one kind of crystal phase selected from the group consisting of AlN, $Si_3N_4$, SiC, $Al_2O_3$, $ZrO_2$, $3Al_2O_3 \cdot 2SiO_2$ and $Mg_2SiO_4$;

and has an open porosity of not larger than 0.3%. The glass ceramic sintered product is highly strong, has a high heat conductivity, a high Young's modulus, is dense, and can be produced through the firing at a low temperature of not higher than 1000° C., and is very useful as an insulating substrate that has wiring layers of a low-resistance conductor such as Cu, Ag or Au on the surface thereof or in the inside thereof.

20 Claims, 2 Drawing Sheets

GLASS CERAMIC SINTERED PRODUCT

BACKGROUND OF THE INVENTION

1. Field of the Invention

The present invention relates to a glass ceramic sintered product which is best suited as an insulating substrate used in a package for accommodating semiconductor devices and in a multi-layer wiring board, and to a process for production thereof.

2. Description of the Prior Art

A rapid development in the information communications technology in recent years has required an increase in the operation speed of the semiconductor devices accompanied by an increase in the sizes thereof and, hence, by a demand for decreasing the resistance of the wiring layer in the wiring board mounting such devices in order to decrease signal transmission losses. To meet this demand, therefore, there has been proposed a wiring board using, as an insulating substrate, a glass ceramics that can be densely formed through the firing at a temperature which is not higher than 1000° C. and can be co-fired together with a wiring layer which is chiefly composed of a low-resistance metal such as silver, copper or gold.

For example, Japanese Unexamined Patent Publication (Kokai) No. 141458/1990 discloses a glass ceramics obtained by adding an $Al_2O_3$ powder and a celsian ($BaAl_2Si_2O_8$) powder to a glass powder which contains $SiO_2$, $Al_2O_3$, CaO, MgO and $B_2O_3$, and describes that even when copper is fired at non-oxidizing atmosphere to form a wiring layer, use of the above glass ceramics as a material of the insulating substrate makes it possible to obtain a wiring board in which carbon is remaining in small amounts without impairing binder-removing property.

Further, Japanese Unexamined Patent Publication (Kokai) No. 305770/1994 discloses a glass ceramics obtained by adding an $Al_2O_3$ powder, a celsian powder and an anorthite powder to a glass powder which contains $SiO_2$, $B_2O_3$, CaO, BaO, $Al_2O_3$, oxides of alkali metals (Li, Na, K), MgO, ZnO, $TiO_2$, and $ZrO_2$, and describes that the above glass ceramics can be fired even in a nonoxidizing atmosphere, and use of the above glass ceramics makes it possible to obtain an insulating substrate having a low dielectric constant and a strength of as large as 2700 $kg/cm^2$.

However, the sintered products obtained from the above-mentioned conventional glass ceramics are not still satisfactory with respect to the mechanical strength as compared to the conventional insulating substrate materials such as aluminous sintered materials, and from which it is not possible to obtain an insulating substrate having a strength of higher than, for example, 2700 $kg/cm^2$. They, further, have a defect of low thermal conductivity. That is, the semiconductor devices that are fabricated in large sizes and that work at high speeds are also accompanied by an increase in the amount of heat that is generated. As a result, the wiring board which uses, as an insulating substrate, a glass ceramic sintered product having a low thermal conductivity arouses such problems as an increased heat resistance and decreased mechanical reliability.

Besides, the conventional glass ceramic sintered products have low Young's moduli. In the case of a package for holding semiconductor devices using the above sintered product as an insulating substrate, for example, the insulating substrate itself is deformed if a metal member is adhered to the surface of the insulating substrate, the metal member being a heat-radiating plate such as-metallic heat sink or heat spreader, or a sealing metal such as a lid or a seal-ring for air-tight sealing by using a closure. Also, when a sealing resin such as a potting agent or an underfilling agent is adhered to the surface of the insulating substrate, the insulating substrate is deformed itself. Therefore, a portion mounting (primarily mounting) of the semiconductor device (chip) is distorted and, in the worst case, the mounting portion is destroyed or the chip is destroyed. Further, when the wiring board having such an insulating substrate is mounted (secondary mounting) on a printed board or the like, the insulating substrate is warped to a large degree due to a difference in the thermal expansion between the insulating substrate and the printed board and, further, due to a small Young's modulus of the insulating substrate, arousing such a problem that the terminal portions are cracked and peeled, and reliability in the electric connection decreases.

SUMMARY OF THE INVENTION

It is therefore an object of the present invention to provide a glass ceramic sintered product having a large strength and a high Young's modulus and which can be co-fired with a low-resistance metal such as silver, copper or gold, and a method of preparing the same.

According to the present invention, there is provided a glass ceramic sintered product obtained by firing a molded article of a mixed powder of a glass powder and a ceramic powder, wherein the glass ceramic sintered product contains as crystal phases:

(i) a gahnite crystal phase;
(ii) a celsian crystal phase containing needle-like crystals having an aspect ratio of not smaller than 3; and
(iii) at least one kind of crystal phase selected from the group consisting of AlN, $Si_3N_4$, SiC, $Al_2O_3$, $ZrO_2$, $3Al_2O_3 \cdot 2SiO_2$ and $Mg_2SiO_4$;

and has an open porosity of not larger than 0.3%.

According to the present invention, there is provided a process for producing a glass ceramic sintered product, comprising the steps of:

preparing a glass powder contains;
  10 to 35% by weight of $SiO_2$,
  1 to 20% by weight of $Al_2O_3$,
  6 to 25% by weight of MgO and/or ZnO,
  5 to 30% by weight of $B_2O_3$, and
  10 to 40% by weight of BaO, mixing the glass powder and at least one kind of ceramic powder selected from the group consisting of AlN, $Si_3N_4$, $Al_2O_3$, $ZrO_2$, $3Al_2O_3 \cdot 2SiO_2$ and $Mg_2SiO_4$ at a weight ratio of from 20:80 to 90:10;

molding the obtained mixed powder; and firing the molded article at a temperature of not higher than 1000° C.

According to the present invention, there is further provided a process for producing a glass ceramic sintered product, comprising the steps of:

preparing a glass powder which containing,
  10 to 40% by weight of $SiO_2$,
  1 to 30% by weight of $Al_2O_3$,
  6 to 25% by weight of MgO and/or ZnO,
  10 to 40% by weight of BaO, and
  1 to 20% by weight of $Y_2O_3$, mixing the glass powder and an $Al_2O_3$ powder at a weight ratio of from 20:80 to 95:5;

molding the obtained mixed powder; and firing the molded article at a temperature of not higher than 1000° C.

DETAILED DESCRIPTION OF THE INVENTION (Glass Ceramic Sintered Product)

Figure 1:
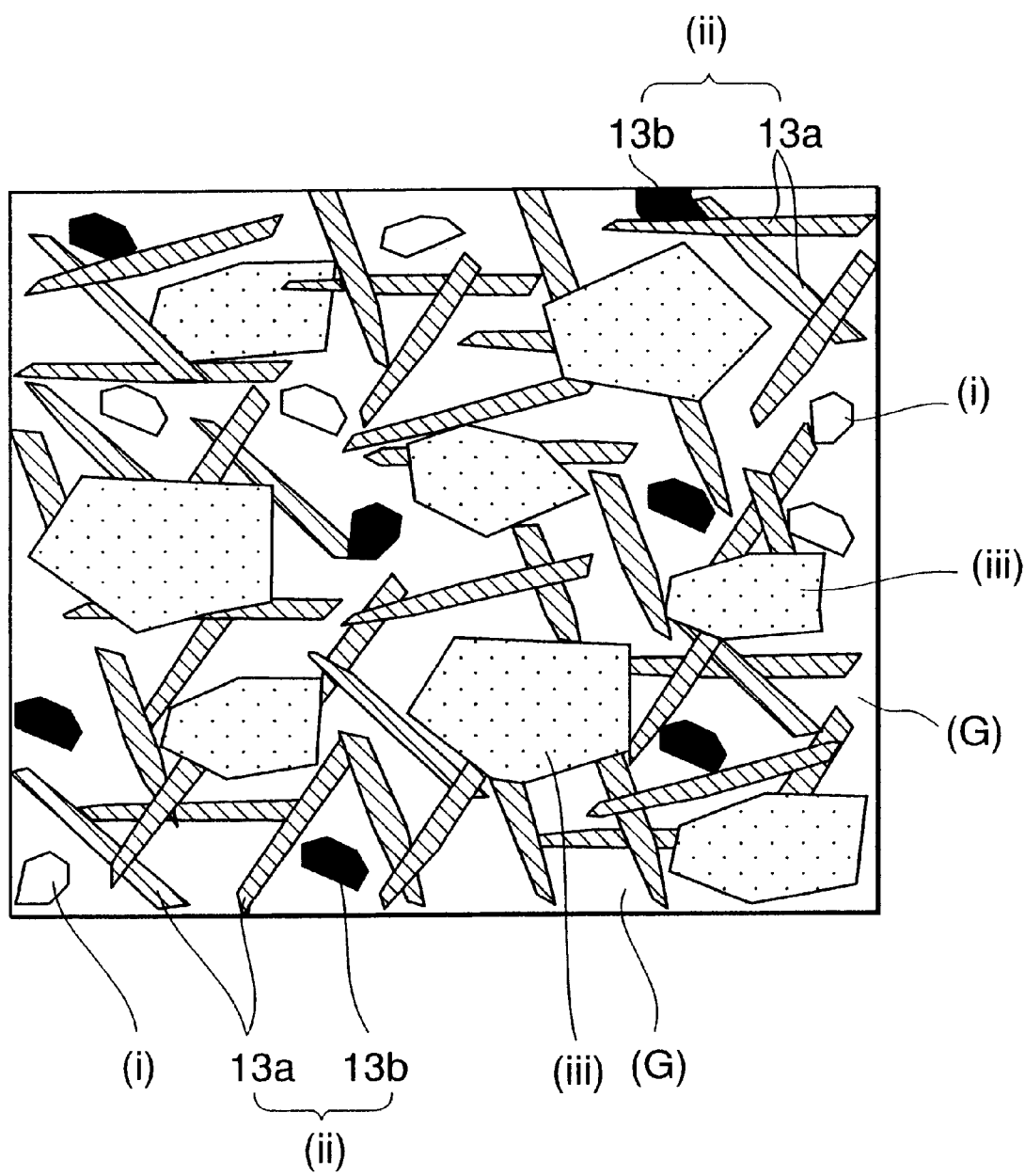
FIG. 1 is a view illustrating the structure of a glass ceramic sintered product of the present invention.

Referring to FIG. 1, the glass ceramic sintered product of the present invention contains at least three kinds of crystal phases (i), (ii) and (iii), and usually, has an amorphous phase (residual glass phase) G that stems from a glass powder on the grain boundaries of these crystal phases.

Crystal Phase (i)

The crystal phase (i) is a gahnite crystal phase having a chemical composition which, ideally, is expressed by $ZnAl_2O_4$. This crystal phase (i) exhibits a Young's modulus of not smaller than 200 GPa as a single crystal. Upon precipitating this crystal phase, therefore, it is allowed to enhance the Young's modulus of the sintered product.

It is desired that the gahnite crystal phase consists of particulate crystals and, particularly, having an average-particle diameter of not larger than 1 $\mu$m. By dispersing such fine crystals in the sintered product, it is allowed to increase the Young's modulus and the flexural strength of the sintered product.

In the present invention, it is desired that the above-mentioned crystal phase (i) is precipitated from the starting glass powder by firing to increase the crystallization degree of the glass, to decrease the content of the amorphous phase (residual glass phase) G that will be described later, to decrease the open porosity of the sintered product and to increase the Young's modulus of the sintered product.

The above crystal phase (i) may contain $MgAl_2O_4$ as a solid solution to form a gahnite crystal phase in the form of $(Zn, Mg)Al_2O_4$, or in which Zn may be substituted for Mg, so that a spinel crystal phase expressed by $ZnAl_2O_4$ precipitates instead of the gahnite crystal phase. That is, MgO and/or Zn contained in the starting glass powder is contained in the crystal phase (i) as a solid solution to increase the crystallization degree of the glass, to decrease the open porosity of the sintered product and to increase the Young's modulus of the sintered product in the same manner as described above. Further, the spinel crystal phase exhibits properties similar to those of the gahnite crystal phase. Upon precipitating the spinel crystal phase, therefore, the same effects are exhibited as those of when the gahnite crystal phase is precipitated.

Crystal Phase (ii)

The crystal phase (ii) is a celsian crystal phase having a chemical composition which, ideally, is expressed as $BaAl_2Si_2O_8$.

In the present invention, it is important that the celsian crystal phase contains needle-like crystals (denoted by 13a in FIG. 1) having an aspect ratio of not smaller than 3, preferably, not smaller than 4 and, more preferably, not smaller than 5. Upon precipitating such needle-like crystals 13a, it is allowed to increase the strength and thermal conductivity of the sintered product, or to decrease the dielectric constant of the sintered product. The aspect ratio of the needle-like crystals stands for an average value found by selecting ten large aspect ratios (ratio of long-axis diameter/short-axis diameter) of the celsian ($BaAl_2Si_2O_8$) crystal phase by observing the cross section of the sintered product by SEM and EPMA analyses. It is desired that the needle-like crystals 13a have a long-axis diameter of 1 to 10 $\mu$m and a short-axis diameter of 0.1 to 2 $\mu$m, and it is particularly desired that the needle-like crystals 13a are dispersed in a random fashion from the standpoint of increasing the flexural strength by suppressing the development of cracking. The celsian crystal phase (ii) may further contain particulate crystals (denoted by 13b in FIG. 1) in addition to the needle-like crystals 13a.

According to the present invention, further, it is desired that the celsian crystal phase (ii) exhibits an X-ray diffraction pattern having a main peak intensity ratio expressed by the formula, $$Ihex/Imon$$

wherein Ihex is a main peak intensity of hexagonal crystals, and Imon is a main peak intensity of monoclinic crystals, of not smaller than 3, preferably, not smaller than 5 and, most preferably, not smaller than 7 from the standpoint of improving the fracture toughness, flexural strength and thermal conductivity. That is, the hexagonal crystals form the needle-like crystals 13a and the monoclinic crystals form the particulate crystals 13b. Therefore, when the main peak intensity ratio lies within the above-mentioned range, the needle-like crystals 13a are precipitated in large amounts and, as a result, the sintered product exhibits improved properties.

The hexagonal crystals exhibit a crystal phase of JCPDS card 28-0124, and the monoclinic crystals exhibit a crystal phase of JCPDS card 38-1450.

Further, the main peaks of the hexagonal crystals and of the monoclinic crystals represent peaks having the greatest intensities in these crystal phases in the diagram of X-ray diffraction, the main peak of the hexagonal crystals corresponding to a peak of a d-value of 3.900 and the main peak of the monoclinic crystals corresponding to a peak of a d-value of 3.355. Accordingly, the ratio of the peak intensities is calculated as $I(d=3.900)/I(d=3.355)$.

It is desired that the above-mentioned celsian crystal phase (ii), too, is precipitated from the starting glass powder by firing like the crystal phase (i) in order to increase the crystallization degree of the glass, to decrease the content of the amorphous phase (residual glass phase) G, to decrease the open porosity of the sintered product and to increase the Young's modulus of the sintered product.

Crystal Phase (iii)

The crystal phase (iii) is a ceramic crystal phase precipitated from the ceramic powder mixed to the glass powder and is, particularly, a crystal phase selected from the group consisting of AlN, $Si_3N_4$, SiC, $Al_2O_3$, $ZrO_2$, $3Al_2O_3 \cdot 2SiO_2$ and $Mg_2SiO_4$. The ceramic crystal phase (iii) is a component which improves the Young's modulus of the sintered product as well as the flexural strength. This crystal phase usually exists as particulate crystals but, desirably, exists as plate-like crystals to further improve the flexural strength and the thermal conductivity of the sintered product.

The ceramic crystal phase (iii) is formed of one or two or more kinds of nitrides, carbides or oxides of the above-mentioned compounds or of composite oxides thereof. From the standpoint of strength and sintering property, however, it is desired that the ceramic crystal phase (iii) contains at least the $Al_2O_3$ crystal phase.

It is further desired that the ceramic crystal phase (iii) is contained in the sintered product in an amount of from 10 to 80% by weight, particularly, from 30 to 75% by weight and, more particularly, from 40 to 70% by weight.

Crystal Phase (iv)

In the glass ceramic sintered product of the present invention, it is desired that a Y (yttrium)-containing crystal phase is contained as the crystal phase (iv)(which is not shown in FIG. 1) in addition to the above-mentioned crystal phases (i) to (iii) from the standpoint of increasing the strength of the sintered product.

Though not limited thereto only, the Y-containing crystals may be $YAlO_3$, $Y_4Al_2O_9$, $BaY_2O_4$, $Ba_4Y_2O_7$, $Y_4Zr_3O_{12}$, or $Y_6ZrO_{11}$, which may be precipitated in one kind or in two or more kinds. It is desired that the Y-containing crystals, too, are precipitated by firing from the starting glass powder like the above-mentioned crystal phases (i) and (ii).

Other Crystal Phases

So far as excellent properties of the glass ceramic sintered product of the present invention are not spoiled, further, there may be contained other crystal phases such as $SiO_2$, $CaAl_2Si_2O_8$, $SrAl_2Si_2O_8$, $Ca_2MgSi_2O_7$, $Sr_2MgSi_2O_7$, $Ba_2MgSi_2O_7$, $ZnO$, $MgSiO_3$, $Zn_2SiO_4$, $ZrSiO_4$, $CaMgSi_2O_6$, $Zn_2Al_4Si_5O_{18}$, $CaSiO_3$, $SrSiO_3$ and $BaSiO_3$ in addition to the above-mentioned various crystal phases. These other crystal phases may be contained in the sintered product in a total amount of not larger than 40% by weight, preferably, not larger than 30% by weight and, most preferably, not larger than 20% by weight.

Amorphous Phase

The sintered product of the present invention is obtained by firing a molded article of a mixed powder of the glass powder and the ceramics powder and, hence, usually contains an amorphous phase (residual glass phase) G as shown in FIG. 1. From the standpoint of improving the Young's modulus of the sintered product, it is desired that the amount of the amorphous phase G is small; e.g., it is desired that the content of glass in the sintered product is not larger than 50% by weight, particularly, not larger than 30% by weight and, more particularly, not larger than 20% by weight and, most particularly, not larger than 10% by weight, and the amorphous glass phase G may not substantially exist in the sintered product. The contents of the crystal phases and of the amorphous phase in the sintered product are found from X-ray diffraction peaks of the sintered product relying upon the Liedbert method.

Composition of the Sintered Product

The glass ceramic sintered product of the present invention contains the above-mentioned crystal phases (i), (ii) and (iii) as essential components and, as required, permits the crystal phase (iv) to precipitate and, hence, possesses a chemical composition depending upon the kind of the crystal phase that is precipitated.

Described below is a preferred chemical composition of the sintered product in which the Y-containing crystal phase (iv) is not precipitated:

$SiO_2$: 2 to 31.5% by weight and, particularly, 4.5 to 21% by weight, $Al_2O_3$: 11 to 82% by weight and, particularly, 32.1 to 74.5% by weight, ZnO: 1.2 to 22.5% by weight and, particularly, 3 to 14% by weight, $B_2O_3$: 1 to 27% by weight and, particularly, 3 to 17.5% by weight, BaO: 2 to 36% by weight and, particularly, 6.3 to 35% by weight, at least the one selected from the group consisting of MgO, CaO and SrO: 0 to 18% by weight and, particularly, 0.2 to 7% by weight, and at least the one selected from the group consisting of $ZrO_2$, $SnO_2$ and $TiO_2$: 0 to 9% by weight and, particularly, 0.2 to 3.5% by weight.

Further, described below is a preferred chemical composition of the sintered product in which the Y-containing crystal phase (iv) is precipitated:

$SiO_2$: 2 to 38% by weight and, particularly, 4.5 to 25.5% by weight, $Al_2O_3$: 6 to 86% by weight and, particularly, 17.6 to 77.5% by weight, BaO: 2 to 38% by weight and, particularly, 6 to 29.8% by weight, $Y_2O_3$: 0.2 to 19% by weight and, particularly, 0.9 to 12.8% by weight, ZnO: 1.2 to 23.8% by weight and, particularly, 2.4 to 12.8% by weight, $B_2O_3$: 0 to 28.5% by weight and, particularly, 0 to 12.3% by weight, at least the one selected from the group consisting of MgO, CaO and SrO: 0 to 19% by weight and, particularly, 0 to 12.8% by weight, and at least the one selected from the group consisting of $ZrO_2$, $SnO_2$ and $TiO_2$: 0 to 9.5% by weight and, particularly, 0 to 5.1% by weight.

The sintered product further contains metal oxides such as PbO and $A_2O$ (A: an alkali metal such as Li, Na, K or Rb) which are impurity components contained in the glass powder and in the ceramic powder. From the standpoint of resistance against environment, chemical resistance and hygroscopic property, however, it is desired that the contents of PbO and $A_2O$ are suppressed to be not larger than 1% by weight and, particularly, not larger than 0.1% by weight. The contents of these components are adjusted by removing impurity components from the glass powder and the ceramic powder that are used.

Since the crystal phases (i) to (iii) have been precipitated, the glass ceramic sintered product of the present invention has an open porosity of not larger than 0.3%, particularly, not larger than 0.25% and, more particularly, not larger than 0.2%, and is very dense yet having a very large thermal conductivity of not smaller than 2 W/mK, particularly, not smaller than 2.5 W/mK and, more particularly, not smaller than 3 W/mK, a flexural strength of not smaller than 280 MPa, particularly, not smaller than 300 MPa and, more particularly, not smaller than 320 MPa, a fracture toughness of not smaller than 1.5 $Mpam^{1/2}$, particularly, not smaller than 1.8 $MPa \cdot m^{1/2}$, and more particularly, not smaller than 2.0 $MPa \cdot m^{1/2}$, and a Young's modulus of not smaller than 100 GPa, particularly, not smaller than 120 GPa and, more particularly, not smaller than 140 GPa.

(Preparation of the Glass Ceramic Sintered Product)

The above-mentioned glass ceramic sintered product of the present invention is obtained by preparing a mixed powder of the glass powder and the ceramic powder, molding the mixed powder into a predetermined shape by using a suitable binder, followed by firing after the binder is removed.

Glass Powder

The glass powder that contains the Y (yttrium) component or does not contain the Y component is used depending upon the crystal structure of the glass ceramic sintered product.

The glass powder without containing the Y (yttrium) component is used for preparing the glass ceramic sintered product in which the Y-containing crystal phase (iv) is not precipitated, and its preferred composition is as follows:

$SiO_2$: 10 to 35% by weight and, particularly, 15 to 30% by weight, $Al_2O_3$: 1 to 20% by weight and, particularly, 3 to 15% by weight, MgO and/or ZnO: 6 to 25% by weight and, particularly, 10 to 20% by weight, $B_2O_3$: 5 to 30% by weight and, particularly, 10 to 25% by weight, BaO: 10 to 40% by weight and, particularly, 10 to 25% by weight, at least the one selected from the group consisting of MgO, CaO and SrO: 0 to 20% by weight and, particularly, 1 to 10% by weight, and at least the one selected from the group consisting of $ZrO_2$, $SnO_2$ and $TiO_2$: 0 to 10% by weight and, particularly, 1 to 5% by weight.

That is, in the glass powder without containing the Y (yttrium) component, when the contents of $SiO_2$, $Al_2O_3$, MgO, ZnO, BaO and $B_2O_3$ exceed the above-mentioned ranges, the open porosity of the sintered products exceeds 0.3% or it becomes difficult to precipitate the above-mentioned particular crystal phases, whereby the Young's modulus of the sintered product decreases, the strength decreases and the thermal conductivity decreases. Among the above-mentioned components, when the contents of $SiO_2$ and $Al_2O_3$ are smaller than the above-mentioned ranges, the softening point of the glass decreases and it becomes difficult to remove the binder at the time of firing. Conversely, when the contents of these components are larger than the above-mentioned ranges, the open porosity of the sintered product tends to increase through the firing at not higher than 1000° C. that will be described later. Further, when the contents of MgO, ZnO, BaO and $B_2O_3$ are smaller than the above-mentioned ranges, the open porosity of the sintered product increases through the firing at not higher than 1000° C., and the amount of the ceramic powder (filler component) that can be added decreases, causing the strength and the thermal conductivity to decrease. When the contents are larger, on the other hand, the softening point of the glass decreases, the binder is poorly removed at the time of firing, and the open porosity tends to increase.

Further, CaO and SrO which are contained as optional components in the starting glass work to suppress the glass from being softened, and further work to precipitate, out of the glass and particularly as needle-like crystals, other crystal phases such as $CaAl_2Si_2O_8$, $SrAl_2Si_2O_8$ crystal phase (particularly, needle-like crystals), $Ca_2MgSi_2O_7$ crystal phase, $Sr_2MgSi_2O_7$ crystal phase, and $MgAl_2O_4$ crystal phase (spinel crystal phase). Therefore, use of the glass powder containing such components is advantageous from the standpoint of controlling the flexural strength and dielectric constant of the sintered product. Besides, at least the one selected from the group consisting of $ZrO_2$, $SnO_2$ and $TiO_2$ is effective in promoting the precipitation of the above-mentioned particular crystal phases (i) and (ii).

The glass powder containing the Y (yttrium) component is used for preparing the glass ceramic sintered product in which the Y-containing crystal phase (iv) is precipitated, and its preferred composition is as follows:

$SiO_2$: 10 to 40% by weight and, particularly, 15 to 30% by weight, $Al_2O_3$: 1 to 30% by weight and, particularly, 3 to 25% by weight, MgO and/or ZnO: 6 to 25% by weight and, particularly, 9 to 20% by weight, BaO: 10 to 40% by weight and, particularly, 15 to 37% by weight, $Y_2O_3$: 1 to 20% by weight, at least the one selected from the group consisting of CaO and SrO: 0 to 20% by weight and, particularly, 1 to 15% by weight, and at least the one selected from the group consisting of $ZrO_2$, $SnO_2$ and $TiO_2$: 0 to 10% by weight and, particularly, 0 to 5% by weight.

That is, in the glass powder containing the Y (yttrium) component, when the contents of $SiO_2$, $Al_2O_3$, MgO, ZnO and BaO exceed the above-mentioned ranges, the open porosity of the sintered products exceeds 0.3% or it becomes difficult to precipitate the above-mentioned particular crystal phases (i) and (ii), whereby the Young's modulus of the sintered product decreases, the strength decreases and the thermal conductivity decreases. When the contents of $SiO_2$ and $Al_2O_3$ are smaller than the above-mentioned ranges, the softening point of the glass decreases and it becomes difficult to remove the binder at the time of firing like in the case of the glass powder without containing the Y component. Conversely, when the contents of these components are larger than the above-mentioned ranges, the open porosity of the sintered product tends to increase through the firing at not higher than 1000° C. Further, when the contents of MgO and ZnO are smaller than the above-mentioned ranges, the open porosity of the sintered product increases through the firing at not higher than 1000° C., and the amount of the ceramic powder (filler component) that can be added decreases, causing the strength and the thermal conductivity to decrease. When the contents are larger, on the other hand, the softening point of the glass decreases, the binder is poorly removed at the time of firing, and the open porosity tends to increase.

Further, $Y_2O_3$ which is contained in the starting glass powder works to precipitate the above-mentioned Y-containing crystal phase (iv) from the glass and to increase the flexural strength of the sintered product. Further, $Y_2O_3$ works to raise the softening point of the glass and to increase the Young's modulus of the amorphous phase (residual glass phase) G stemming from the glass powder. For example, when the glass ceramic sintered product of the present invention is used as an insulating substrate of the wiring board having, as a wiring layer, copper having excellent resistance against migration, the glass transition point (Tg) of the glass powder must be raised to not lower than 500° C. and, particularly, to 550 to 850° C. to make it possible to remove the binder in the nonoxidizing atmosphere. However, when the glass powder having a glass transition point which is shifted to such a high temperature side is used, the content of the ceramic crystal phase which is the filler component becomes insufficient and, particularly, the content of the $Al_2O_3$ crystal phase becomes insufficient, causing the insulating substrate (glass ceramic sintered product) to lose the flexural strength. However, use of the glass powder containing $Y_2O_3$ helps improve the Young's modulus of the residual glass phase G and, hence, effectively prevents a decrease in the flexural strength. Further, $Y_2O_3$ also works as a crystallizing agent. In a glass containing $Y_2O_3$, precipitation of the $ZnAl_2O_4$ crystal phase (i) and the celsian crystal phase (ii) out of the glass is promoted to increase the content of these crystal phases (i.e., the $Y_2O_3$ content in the glass powder is adjusted to control the contents of the crystal phases (i) and (ii) precipitated in the sintered product). In the present invention, when the $Y_2O_3$ content in the glass powder is smaller than the above-mentioned range, the effect for increasing the strength is not sufficient. When the $Y_2O_3$ content is larger than the above-mentioned range, the open porosity of the sintered product exceeds 0.3%.

In the above-mentioned Y component-containing glass powder, other components, i.e., CaO and SrO or at least one component selected from the group consisting of $ZrO_2$, $SnO_2$ and $TiO_2$ exhibit the same function as those components described in relation to the glass powder without containing the Y component.

In the present invention, it is preferable that the glass powder without containing the above-mentioned Y component has a glass transition point (Tg) of 500 to 850° C. and that the glass powder containing the Y component has a glass transition point (Tg) of from 550 to 850° C. The glass powders having such a glass transition point (Tg) are advantageously used when the glass ceramic sintered product is used as an insulating substrate in the wiring board (which, particularly, is provided with the a copper wiring layer). That is, to prepare the wiring board having a copper wiring layer, the heat treatment must be conducted in a nonoxidizing atmosphere and, for example, the heat treatment for removing the binder, too, is conducted in the nonoxidizing atmosphere. Here, if the glass transition point is lower than the above range, the shrink start temperature of the sintered product becomes too low making it difficult to effectively remove the binder. If the glass transition point of the glass powder is higher than 850° C., on the other hand, a densely sintered product is not obtained through the firing at a temperature of not higher than 1000° C., and the open porosity exceeds 0.3%.

It is further desired that the PbO content and the $A_2O$ content (A: alkali metal) in the glass powder are suppressed to be not larger than 1% by weight and, particularly, not larger than 0.1% by weight, respectively, from the standpoint of resistance against environment, chemical resistance and hygroscopic property as described already.

Ceramic Powder

In the present invention, the ceramic powder (filler component) mixed into the above-mentioned glass powder is at least one selected from the group consisting of AlN, $Si_3N_4$, SiC, $Al_2O_3$, $ZrO_2$, $3Al_2O_3 \cdot 2SiO_2$ and $Mg_2SiO_4$. That is, the ceramic powder is used for making the above-mentioned crystal phase (iii) present in the sintered product. In the present invention, the ceramic powder is preferably the $Al_2O_3$ powder from the standpoint of its good wettability for the above-mentioned glass powder and favorable sintering property at a temperature of not higher than 1000° C. In particular, when the Y component-containing glass powder is used as the above-mentioned glass powder, the $Al_2O_3$ powder is best suited as the ceramic powder.

In order to decrease the amount of voids in the sintered product and to enhance the Young's modulus, flexural strength and thermal conductivity, further, it is desired that the ceramic powder has the ratio of the pressurized bulk density to the true density of (pressurized bulk density/true density) is not smaller than 0.5, particularly, not smaller than 0.52 and, most particularly, not smaller than 0.54. This makes it possible to decrease the open porosity of the sintered product to be not larger than, for example, 0.3.

Here, the pressurized bulk density of the ceramic powder stands for a density of the molded article obtained by monoaxially molding 2 g of the ceramic powder in the shape of a cylinder of a diameter of 20 mm under a condition of a pressure of 98 MPa×30 sec. The pressurized bulk density ratio of the ceramic powder can be effectively set to lie within the above-mentioned range by increasing the pressurized bulk density of the ceramic powder by controlling the particle size distribution, by using a ceramic powder which aggregates less, or by using two or more kinds of ceramic powders having different average particle diameters so that there exist two or more peak values in the particle diameters.

Preparation of a Mixed Powder

According to the present invention, the above-mentioned glass powder and the ceramic powder are mixed together, and are pulverized by adding, as required, a suitable solvent, to prepare a mixed powder in which the two powders are homogeneously dispersed in each other.

In preparing the mixed powder, there may be used the glass powder without containing the Y component. In this case, it is desired that the glass powder and the ceramic powder are used at a weight ratio of from 20:80 to 90:10, preferably, from 25:75 to 80:20 and, most preferably, from 30:70 to 70:30. When the glass powder containing the Y component is used, it is desired that the glass powder and the ceramic powder (particularly, $Al_2O_3$) are used at a weight ratio of from 20:80 to 95:5, preferably, from 25:75 to 90:10 and, most preferably, from 30:70 to 85:15.

When the amount of addition of the ceramic powder (or $Al_2O_3$ powder) is smaller than the above-mentioned range, the sintered product exhibits a decreased Young's modulus, a decreased strength and a decreased thermal conductivity. When the amount of addition is larger than the above-mentioned range, the open porosity of the sintered product cannot be decreased down to, for example, not larger than 0.3% through the firing at not higher than 1000° C. and it becomes difficult to obtain a densely sintered product.

Concerning the mixed powder of the above-mentioned glass powder and the ceramic powder, too, it is desired that the ratio of pressurized bulk density/true density is not smaller than 0.45, particularly, not smaller than 0.5 and, most desirably, not smaller than 0.54.

In the present invention, further, the mixing ratio of the glass powder and the particular ceramic powder is satisfying the above-mentioned ratio of amounts, and it is allowed to add other ceramics powders such as of $SiO_2$, $CaAl_2Si_2O_8$, $SrAl_2Si_2O_8$, $Ca_2MgSi_2O_7$, $Sr_2MgSi_2O_7$, $Ba_2MgSi_2O_7$, ZnO, $MgSiO_3$, $Zn_2SiO_4$, $ZrSiO_4$, $CaMgSi_2O_6$, $Zn_2Al_4Si_5O_{18}$, $CaSiO_3$, $SrSiO_3$ and $BaSiO_3$ in addition to the above-mentioned various crystal phases so far as the sintered product does not lose the properties such as Young's modulus, strength, thermal conductivity, etc. They exist as other crystal phases that are described above.

Molding

The mixed powder prepared as described above may, as required, be added and mixed with an organic binder, a plasticizer and a solvent to prepare a slurry thereof (for molding) from which a molded article of a predetermined shape is obtained by a known molding method, such as doctor blade method, calender roll method, rolling method, press molding, extrusion molding, injection molding, cast molding or tape molding.

Firing

The thus obtained molded article is subjected to the binder-removing treatment at 450 to 750° C. and is, then, fired in an oxidizing atmosphere or in a nonoxidizing atmosphere at a temperature of not higher than 1000° C., preferably, at 700 to 1000° C. and, more preferably, at 800 to 950° C. to obtain the glass ceramic sintered product of the present invention.

In order to have the above-mentioned particular crystal phases (i) and (ii) precipitated in the sintered product or to lower the open porosity of the sintered product, it is desired to raise the temperature at a rate of 20° C./hour after the binder-removing treatment and to hold the firing temperature for 0.2 to 10 hours and, particularly, for 0.5 to 2 hours.

(Wiring Board)

The above-mentioned glass ceramic sintered product is very useful as an insulating substrate in various wiring boards.

Figure 2:
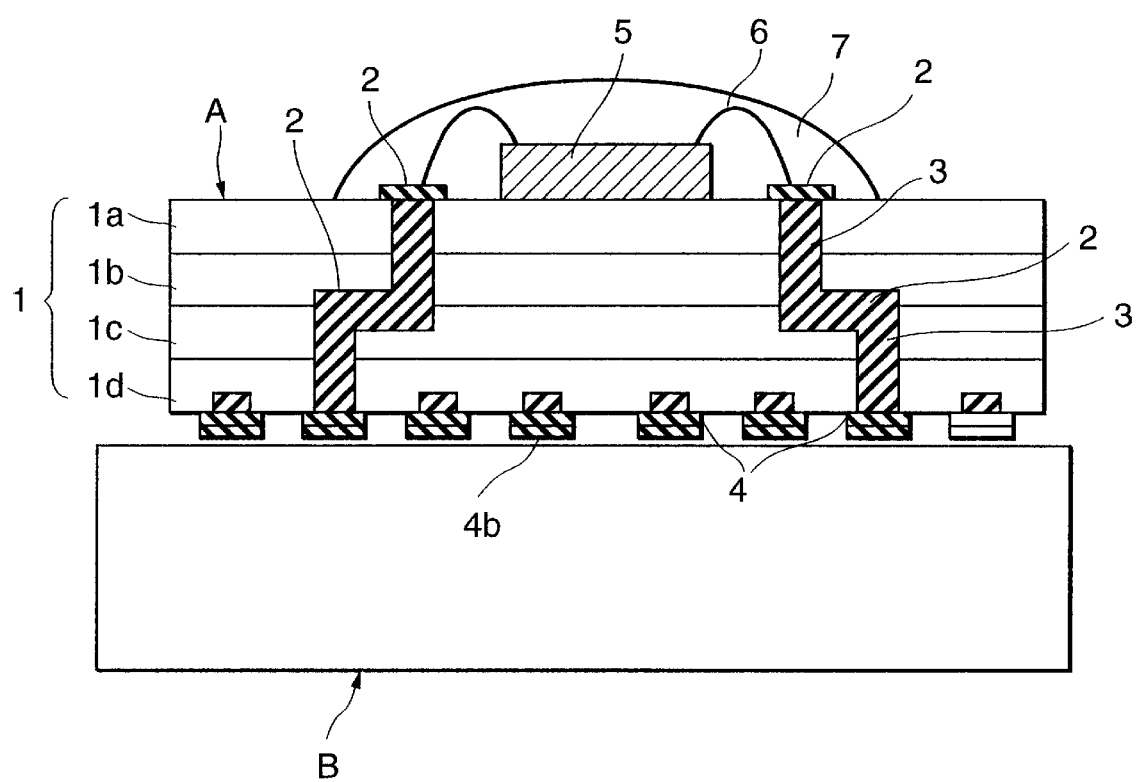
FIG. 2 is a side sectional view illustrating a wiring board (package for accommodating a semiconductor device) by using the glass ceramic sintered product of the present invention as an insulating substrate.

FIG. 2 is a sectional view schematically illustrating a representative package for accommodating a semiconductor device, as a wiring board.

In FIG. 2, the package A includes an insulating substrate 1 comprising plural insulating layers 1a to 1d. Wiring layers 2, 2 of a low-resistance metal such as silver, copper or gold are formed on the surface of the insulating substrate 1 and in the inside thereof.

Via-hole conductors 3 are formed penetrating through the insulating layers 1a to 1d to electrically connect the wiring layers 2, 2. The via-hole conductors 3 contain a low-resistance metal such as silver, copper or gold.

Further, plural electrodes 4 for connection are arranged on the lower surface of the package A, and are connected to electrodes 4B for connection of an external circuit board B such as a printed board.

A device 5 such as a semiconductor device is adhered and secured onto the central portion on the upper surface of the insulating substrate 1 via an adhesive (not shown) such as a glass or an underfilling agent, the surface of the device 5 is sealed with a sealing resin 7 which is a potting agent or the like. The device 5 is electrically connected to the wiring layers 2 by bonding wires 6. Accordingly, the device 5 is electrically connected to the plural electrodes 4 for connection formed on the lower surface of the insulating substrate 1 through the wiring layers 2 and the via-hole conductors 3.

In the present invention, the insulating substrate 1 is formed of the above-mentioned glass ceramic sintered product making it possible to increase the strength and the thermal conductivity of the insulating substrate 1 and, hence, to improve the mounting reliability and the mechanical reliability of the package A. Besides, since heat generated in the device 5 is efficiently radiated, a rise in the temperature of the insulating substrate 1 is effectively suppressed and the device 5 is prevented from erroneously operating.

Further, since the insulating substrate 1 is formed by firing at a low temperature which is not higher than 1000° C., it is allowed to form the wiring layers 2 by co-firing by using a low-resistance conductor comprising chiefly at least one low-resistance metal selected from silver, copper and gold. Accordingly, the wiring layers 2 have a low resistance decreasing a delay of signals.

In FIG. 2, though the device 5 is connected to the wiring layers 2 by bonding wires 6, it is also allowable to directly connect the device 5 to the wiring layers 2 on the surface of the insulating substrate 1 by soldering or the like. Instead of using the sealing resin 7, further, it is also possible to accommodate the device 5 by forming a cavity in the surface of the insulating substrate 1 and to seal the cavity, in which the device 5 is accommodated, by using a closure such as a sealing metal fitting (not shown) or the like.

According to the present invention, the insulating substrate 1 made of the glass ceramic sintered product of the present invention has a Young's modulus which is as high as 100 GPa or more. Therefore, the insulating substrate 1 does not greatly warp even when a sealing metal fitting or a sealing resin is adhered thereto, and a portion (primary mounting) which is mounting the semiconductor device is not distorted. Besides, stress does not concentrate on the electrodes 4 for connection, and the electrodes 4, 4B for connection (secondary mounting portions) are not cracked or peeled, and a highly reliable mounting is maintained.

The wiring board like the above-mentioned package can be prepared in the same manner as that of preparing the above-mentioned glass ceramic sintered product.

That is, a slurry for molding is prepared by using a mixed powder in which the above-mentioned glass powder and the ceramic powder are mixed together in amounts of a predetermined ratio, and from which a ceramic green sheet (for forming insulating layers 31a to 31d) having a thickness of 50 to 500 $\mu$m) is molded.

Through holes are formed in the green sheet at predetermined positions and are filled with an electrically conducting paste containing a low-resistance metal such as copper, silver or gold. By using the above-mentioned electrically conducting paste, further, a wiring pattern is printed on the surface of the green sheet which serves as the insulating layer on which the surface is formed the wiring layers 2 relying upon a known printing method such as a screen printing method or a gravure printing method, in a manner that the wiring layers 2 have a thickness of 5 to 30 $\mu$m.

Plural green sheets prepared as described above are placed in position, laminated one upon the other and adhered together with pressure and are, then, put to the binder-removing treatment in an oxidizing atmosphere, in a lowly oxidizing atmosphere or in a nonoxidizing atmosphere, and are fired at a temperature of not higher than 1000° C. in the oxidizing atmosphere or in the nonoxidizing atmosphere to prepare the insulating substrate 1 having wiring layers 2.

The binder-removing atmosphere or the firing atmosphere is suitably determined depending upon the kind of the low-resistance metal that is used. When a metal that oxidizes by the firing in the oxidizing atmosphere, such as copper, is used, the binder is removed or the firing is conducted in the nonoxidizing atmosphere.

The device 5 such as the semiconductor element is mounted on the surface of the thus formed insulating substrate 1 and is so connected that the signals can be transmitted to the wiring layers 2. As described earlier, the device 5 can be directly mounted on the wiring layers 2 to connect them together, or the device 5 can be connected to the wiring layers 2 on the surface of the insulating substrate 1 by bonding wires 6. Further, the two may be connected together by using a flip chip or the like.

Further, the sealing resin 7 is applied on the surface of the insulating substrate 1 on which the device 5 is mounted, and is cured, or a closure made of the same insulating material as the insulating substrate 1, other insulating material, or a metal having good heat-radiating property, is joined thereto using an adhesive such as a glass, a resin or a wax, in order to air-tightly seal the device 5 and, hence, to prepare the package A.

As described above, the glass ceramic sintered product of the present invention can be prepared by firing at a low temperature which is not higher than 1000° C. By using the sintered product as a material of the insulating substrate, the wiring layers formed of a low-resistance conductor such as Cu, Ag or Au and the insulating substrate can be formed at one time by co-firing enhancing the efficiency for producing various wiring boards.

FIG. 2 has illustrated an example of forming the insulating substrate 1 and the wiring layers 2 by co-firing by applying the paste containing the low-resistance conductor onto the ceramic green sheet for forming the insulating layers. When the insulating substrate 1 is formed of the glass ceramic sintered product of the present invention, however, fine wiring layers (e.g., having a width of not larger than 75 $\mu$m, a gap among the wiring layers of not larger than 75 $\mu$m and a thickness of 1 to 10 $\mu$m) can be formed maintaining a high precision by using a low-resistance conductor such as Cu, Ag, Au or Al relying upon the so-called thin-film forming method.

If described with reference to the insulating substrate 1 of FIG. 2, the insulating substrate 1 having via-hole conductors 3 is prepared by the above-mentioned method. The insulating substrate 1 may be formed of a single insulating layer and in which the above-mentioned wiring layers 2 may have been formed by co-firing. On the surface of the insulating substrate 1 is formed a thin-film metal layer of a low-resistance conductor such as Cu, Ag, Au or Al by the thin-film forming method such as sputtering, ion plating or vacuum vaporization. Then, the wiring layer of the above-mentioned fine pattern is formed on the surface of the insulating substrate 1 by applying a resist thereon, by exposing the surface to light through a mask of a predetermined pattern, by removing the metal layer of unnecessary portions by etching and by removing the resist.

The glass ceramic sintered product of the present invention has an open porosity of as small as not larger than 0.3%, contains little voids, and has a good surface smoothness. By utilizing the above-mentioned thin-film forming method, therefore, the wiring layers of a fine pattern can be highly precisely formed on the surface of the insulating substrate 1 formed of the sintered product without accompanied by inconvenience such as deviation in position. Further, prior to forming the thin metal layer on the surface of the insulating substrate 1 by the thin-film forming method, it is desired to form the surface of the substrate 1 maintaining a surface roughness Ra (JIS B0601) of not larger than 0.1 $\mu$m and, particularly, not larger than 0.05 $\mu$m. Here, however, the insulating substrate 1 formed of the glass ceramic sintered product of the present invention has excellent surface smoothness, and its fired surface has a surface roughness Ra of not larger than 1.0 $\mu$m and, particularly, not larger than 0.5 $\mu$m. Therefore, the above-mentioned polishing can be easily executed within short periods of time, and the present invention is advantageous in this respect, too.

Further, the glass ceramic sintered product of the present invention has excellent mechanical properties such as strength and the like, making it possible to obtain the insulating substrate 1 in a thickness of not larger than 0.5 mm, particularly, not larger than 0.4 mm, and more particularly, not larger than 0.2 mm, lending itself well for the preparation of wiring boards having a decreased thickness and a high mechanical reliability.

EXAMPLES (Experiment 1)

Three kinds of glass powders (each having an average particle diameter of 2 $\mu$m) of the following compositions were prepared.

Glass A: $SiO_2$, 28% by weight—$Al_2O_3$, 10% by weight—ZnO, 15% by weight—$B_2O_3$, 18% by weight—BaO, 28% by weight—$ZrO_2$, 1% by weight (glass transition point: 610° C.).

Glass B: $SiO_2$, 20% by weight—$Al_2O_3$, 8% by weight—ZnO, 20% by weight—$B_2O_3$, 21% by weight—BaO, 20% by weight—SrO, 9% by weight—$ZrO_2$, 1% by weight—$TiO_2$, 1% by weight (glass transition point: 570° C.).

Glass C: $SiO_2$, 24% by weight—$Al_2O_3$, 8% by weight—ZnO, 15% by weight—$B_2O_3$, 18% by weight—BaO, 26% by weight—SrO, 1% by weight—CaO, 5% by weight—$SnO_2$, 1% by weight—$ZrO_2$, 2% by weight (glass transition point: 590° C.).

Ceramic powders having average particle diameters of 1 to 2 $\mu$m shown in Table 1 were introduced each in an amount of 2 g into a metal mold having a diameter of 20 mm and were monoaxially press-molded with a pressure of 98 MPa for 30 seconds, and the densities of the molded articles were calculated as the pressurized bulk densities. Further, true densities were measured by the He substitution method, and the ratios of pressurized bulk densities/true densities were calculated to be as shown in Table 1.

The above-mentioned glass powders and the ceramic powders were mixed together according to the compositions shown in Table 1, and to the mixture were added an organic binder, a plasticizer and toluene to prepare slurries from which sheet-like molded articles having a thickness of 300 $\mu$m were prepared by the doctor blade method. The sheet-like molded articles were laminated in a plural number to obtain a desired thickness, and were thermally adhered together at a temperature of 60° C. with the application of pressure of 10 MPa.

The obtained laminates were subjected to the binder-removing treatment in the open air at 500° C. and were fired in the open air under the conditions shown in Table 1 by raising the temperature at a rate of 200° C./hour to obtain ceramic sintered products.

Next, the obtained ceramic sintered products were measured for their open porosities by the Archimedes' method. Further, the Young's moduli were measured by the ultrasonic wave pulse method. The ceramic sintered products were further machined to possess a diameter of 10 mm and a thickness of 1.5 mm, and were measured for their thermal conductivities by the laser flash method. The ceramic sintered products were further machined to a size of 3 mm×4 mm×50 mm, and were measured for their three-point flexural strengths in compliance with JIS R-1601 by using an autograph. The ceramic sintered products were further polished like a mirror surface to measure the fracture toughnesses by the IF method. The results were as shown in Table 2.

The ceramic sintered product were further machined to possess a diameter of 16 mm and a thickness of 2 mm, and an In—Ga paste was applied onto both surfaces thereof to form electrodes, and electrostatic capacities were measured at a frequency of 1 MHz by using an LCR meter to calculate specific inductive capacities from the sizes of the samples. Further, the crystal phases in the ceramic sintered products were identified from the measurement of X-ray diffraction, and peak intensities were compared.

As for the $BaAl_2Si_2O_8$ crystal phase, an intensity ratio I(d=3.900)/I(d=3.355) was calculated with the main peak of hexagonal crystals as d=3.900 and the main peak of monoclinic crystals as d=3.355.

Further, the ceramic sintered products were polished like a mirror surface, and aspect ratios of the $BaAl_2Si_2O_8$ crystal phase (needle-like crystals) were calculated from a scanning electron microphotograph (SEM). The results were as shown in Table 2.

As Comparative Examples, further, the properties were evaluated in the same manner as described above by using glasses D and E of the following compositions instead of using the above-mentioned glasses A, B and C.

Glass D: $SiO_2$, 43% by weight—$Al_2O_3$, 7% by weight—$B_2O_3$, 8% by weight—BaO, 37% by weight—CaO, 5% by weight (glass transition point: 640° C.).

Glass E: $SiO_2$, 10% by weight—$Al_2O_3$, 3% by weight—ZnO, 35% by weight—$B_2O_3$, 45% by weight—$Na_2O$, 7% by weight (glass transition point: 650° C.).

TABLE 1

| Sample No. | Glass Kind | Glass % by wt. | Ceramic powder Kind | Ceramic powder Density ratio 1) | Ceramic powder % by wt. | Mixed powder Density ratio 1) | Firing condition Temp. (°C.) | Firing condition Time (hr) |
|---|---|---|---|---|---|---|---|---|
| *1 | A | 95 | $Al_2O_3$ | 0.6 | 5 | 0.58 | 700 | 0.5 |
| 2 | A | 90 | $Al_2O_3$ | 0.6 | 10 | 0.58 | 800 | 1 |
| 3 | A | 70 | $Al_2O_3$ | 0.6 | 30 | 0.57 | 800 | 1 |
| 4 | A | 50 | $Al_2O_3$ | 0.6 | 50 | 0.57 | 800 | 1 |
| 5 | A | 50 | AlN | 0.58 | 50 | 0.56 | 800 | 1 |
| 6 | A | 30 | $Al_2O_3$ | 0.6 | 60 | 0.54 | 950 | 3 |
|   |   |    | $CaSiO_3$ | 0.52 | 10 |      |     |   |
| 7 | B | 50 | $Al_2O_3$ | 0.6 | 50 | 0.56 | 800 | 1 |
| 8 | B | 35 | $Al_2O_3$ | 0.6 | 65 | 0.55 | 950 | 1 |
| *9 | B | 15 | $Al_2O_3$ | 0.6 | 85 | 0.56 | 1000 | 5 |
| 10 | B | 50 | AlN | 0.6 | 50 | 0.55 | 850 | 1 |
| *11 | C | 95 | $Al_2O_3$ | 0.6 | 5 | 0.58 | 750 | 1 |
| 12 | C | 70 | $Al_2O_3$ | 0.6 | 30 | 0.58 | 800 | 1 |
| 13 | C | 45 | $Al_2O_3$ | 0.6 | 55 | 0.57 | 800 | 1 |
| 14 | C | 30 | $Al_2O_3$ | 0.6 | 65 | 0.55 | 950 | 2 |
|   |   |    | $CaSiO_3$ | 0.52 | 5 |     |     |   |
| 15 | C | 50 | $Si_3N_4$ | 0.55 | 50 | 0.54 | 850 | 1 |
| 16 | C | 50 | SiC | 0.54 | 50 | 0.53 | 800 | 1 |
| 17 | C | 70 | AlN | 0.58 | 30 | 0.56 | 800 | 1 |
| 18 | C | 50 | AlN | 0.58 | 50 | 0.56 | 850 | 1 |
| 19 | C | 50 | $3Al_2O_3 \cdot 2SiO_2$ | 0.57 | 50 | 0.55 | 900 | 1 |
| 20 | C | 70 | $ZrO_2$ | 0.6 | 30 | 0.57 | 900 | 1 |
| 21 | C | 50 | $Mg_2SiO_4$ | 0.58 | 50 | 0.56 | 850 | 1 |
| 22 | C | 50 | $MgAl_2O_4$ | 0.58 | 50 | 0.56 | 900 | 1 |
| *23 | C | 50 | cordierite | 0.52 | 50 | 0.51 | 950 | 1 |
| *24 | C | 70 | $CaSiO_3$ | 0.52 | 30 | 0.51 | 800 | 1 |
| *25 | D | 60 | $Al_2O_3$ | 0.6 | 40 | 0.48 | 900 | 1 |
| *26 | E | 60 | $Al_2O_3$ | 0.6 | 40 | 0.55 | 900 | 1 |

Samples marked with * lie outside the scope of the invention.
1) Density ratio: pressurized bulk density/true density

TABLE 2

| Sample No. | Sample porosity (%) | Flexural strength (MPa) | Thermal conductivity (W/mk) | Young's modulus (GPa) | Breaking toughness (MPa√m) | Precipitated crystal phase 2) | Main peak intensity ratio I(hex)/I(mon.) | Aspect ratio of BAS |
|---|---|---|---|---|---|---|---|---|
| *1 | 0.1 | | | | could not be evaluated | | | |
| 2 | <0.05 | 280 | 2.3 | 102 | 1.5 | H>Ga>M>A | 20 | >10 |
| 3 | 0.1 | 300 | 2.7 | 126 | 1.7 | H>A>Ga>M | 22 | >10 |
| 4 | <0.05 | 350 | 2.7 | 152 | 2.2 | H>A>Ga>M | 28 | >10 |
| 5 | 0.25 | 320 | 4.9 | 140 | 2.1 | H>A>Ga>M | 26 | >10 |
| 6 | 0.25 | 290 | 3.2 | 148 | 2.0 | H>A>Ga>M | 8.5 | 6 |
| 7 | 0.1 | 290 | 4 | 148 | 1.7 | H>A>Ga>M>SAS | 12 | >10 |
| 8 | 0.1 | 350 | 4.7 | 138 | 2.3 | H>A>Ga>M>SAS | 15 | >10 |
| *9 | 14.6 | — | — | — | — | H>M>A>Ga>SAS | 2.8 | — |
| 10 | 0.15 | 290 | 5.5 | 132 | 2.1 | AlN>H>Ga>M>SAS | 10 | >10 |
| *11 | <0.05 | | | | could not be evaluated | | | |
| 12 | <0.05 | 300 | 3.5 | 107 | 2.2 | H>Ga>A>M | 34 | >10 |
| 13 | <0.05 | 420 | 4 | 162 | 2.5 | H>Ga>A>M | 35 | >10 |
| 14 | 0.1 | 370 | 4.5 | 156 | 2.4 | H>Ga>M>A | 12 | 8 |
| 15 | 0.25 | 320 | 5.2 | 140 | 2.0 | H>$Si_3N_4$>Ga>M | 23 | >10 |
| 16 | 0.55 | 300 | 6.2 | 170 | 2.6 | H>SiC>Ga>M | 16 | >10 |
| 17 | 0.2 | 310 | 4.7 | 124 | 2.1 | H>AlN>Ga>M | 29 | >10 |
| 18 | 0.15 | 350 | 5.8 | 143 | 2.4 | H>AlN>Ga>M | 30 | >10 |
| 19 | 0.3 | 290 | 2.6 | 120 | 1.9 | H>M>Mu>Ga | 5.7 | 8 |
| 20 | 0.25 | 440 | 2.1 | 148 | 3.0 | H>Ga>$ZrO_2$>M | 25 | >10 |
| 21 | 0.2 | 350 | 3.1 | 138 | 2.0 | H>Ga>M>Fo | 12 | 8 |
| 22 | 0.25 | 360 | 2.1 | 148 | 2.2 | H>Ga>M>Su | 28 | >10 |
| *23 | 0.45 | 220 | 2.1 | 81 | 1.4 | H>M>Co>Ga | 2.1 | 5 |
| *24 | 0.1 | 180 | 0.8 | 72 | 1.3 | H>M>A | 1.2 | 4 |
| *25 | 0.4 | 200 | 1.8 | 87 | 1.1 | A | — | — |
| *26 | 0.5 | 190 | 1.1 | 69 | 0.9 | A | — | — |

Samples marked with * lie outside the scope of the invention
2) H: $BaAl_2Si_2O_{8(hex.)}$, M: $BaAl_2Si_2O_{8(mon.)}$, A: $Al_2O_3$, Ga: $ZnAl_2O_4$, SAS: $SrAl_2Si_2O_8$, Mu: $3Al_2O_3 \cdot 2SiO_2$ Co: cordierite, Su: $MgAl_2O_4$, Fo: $Mg_2SiO_4$ As will be obvious from the results of Tables 1 and 2, the samples Nos. 2 to 8, 10, 12 to 22 in which the crystal phases corresponding to the above-mentioned crystal phases (i) to (iii) are precipitated and in which the celsian phase (ii) ($BaAl_2Si_2O_8$ crystal phase) contains needle-like crystals having an aspect of at least not smaller than 3, exhibited intensity ratios I(hex)/I(mon) of main peaks of hexagonal crystals (hex) to main peaks of monoclinic crystals (mono) of not smaller than 3 in the X-ray diffraction measurement, open porosities of not larger than 0.3%, flexural strengths of not smaller than 280 MPa, thermal conductivities of not smaller than 2 W/mK, Young's moduli of not smaller than 100 GPa and fracture toughness of not smaller than 1.5 MPa·m$^{1/2}$. The sintered products were measured for their surface roughness Ra on their fired surfaces to be all not larger than 0.5 μm.

In the samples Nos. 1 and 11 containing the glass powder in an amount of larger than 90% by weight, the components have partly flown out due to the firing at not lower than 800° C. since the amount of the filler was not sufficient, and proper samples could not be prepared. In the sample No. 9 containing the glass powder in an amount of not larger than 20% by weight, the open porosity was so large that a dense ceramic sintered product could not be obtained.

In the samples Nos. 23 and 24 without containing the crystal phase (iii) selected from the group consisting of AlN, Si$_3$N$_4$, SiC, Al$_2$O$_3$, ZrO$_2$, 3Al$_2$O$_3$·2SiO$_2$ and Mg$_2$SiO$_4$, the flexural strengths were lower than 280 MPa and the Young's moduli were smaller than 100 GPa.

In the samples Nos. 25 and 26 using the glasses D and E without containing a predetermined amount of ZnO or BaO, the flexural strengths were smaller than 280 MPa, the thermal conductivities were smaller than 2 W/mK, the Young's moduli were smaller than 100 GPa, and the fracture toughnesses were smaller than 1.5 MPa·m$^{1/2}$.

(Experiment 2)

An acrylic binder, a plasticizer and toluene were added and mixed to the starting powder of the sample No. 10 of Experiment 1, and a sheet-like molded article having a thickness of 250 μm was obtained by the doctor blade method. Then, via-holes were formed in the sheet-like molded article at predetermined positions and were filled with an electrically conducting paste comprising silver as a chief component, and a wiring pattern was formed on the surface of the sheet-like molded article by the screen printing method by using the electrically conducting paste.

Four pieces of the sheet-like molded articles on which the wiring patterns have been formed were placed in position, laminated one upon the other and were thermally adhered together with pressure. The laminate was subjected to the binder-removing treatment in the open air at 500° C., heated at a rate of 200° C./hour, and was fired in the open air at 800° C. for one hour to prepare a wiring board having wiring layers composed chiefly of silver.

A semiconductor device was mounted on the obtained wiring board and was sealed with a sealing agent. However, the wiring board did not warp. Further, the wiring layers were confirmed to contain no breaking portion, and favorable conduction properties were exhibited with low resistance.

(Experiment 3)

Two kinds of glass powders (each having an average particle diameter of 2 μm) of the following compositions were prepared.

Glass F: SiO$_2$, 29% by weight—Al$_2$O$_3$, 12% by weight—ZnO, 15% by weight—B$_2$O$_3$, 10% by weight—BaO, 30% by weight—ZrO$_2$, 1% by weight—Y$_2$O$_3$, 3% by weight (glass transition point: 660° C.).

Glass G: SiO$_2$, 24% by weight—Al$_2$O$_3$, 8% by weight—ZnO, 7% by weight—MgO, 8% by weight—B$_2$O$_3$, 10% by weight—BaO, 26% by weight—SrO, 1% by weight —CaO, 5% by weight—SnO$_2$, 1% by weight—ZrO$_2$, 2% by weight—Y$_2$O$_3$, 8% by weight (glass transition point: 500° C.).

Metal oxide powders having average particle diameters of 1 to 2 μm shown in Table 3 were mixed into these glass powders in compliance with the compositions shown in Table 3.

By using these mixtures, the glass ceramic sintered products were obtained in the same manner as in Experiment 1 (firing temperatures were as shown in Table 3).

The obtained sintered products were measured for their open porosities, thermal conductivities and three-point flexural strengths in the same manner as in Experiment 1. Further, the crystal phases in the sintered products were identified from the X-ray diffraction measurement. The results were as shown in Table 3. The identified crystal phases were shown in Table 3 in order of decreasing peak intensities.

In the same manner as in Experiment 1, further, the sintered products were polished like a mirror surface, and the aspect ratios of the BaAl$_2$Si$_2$O$_8$ crystal phase were calculated from the scanning electron microscope (SEM). The results were as shown in Table 3.

TABLE 3

| Sample No. | Glass Kind | Glass % by wt. | Metal Oxide Kind | Metal Oxide % by wt. | Firing condition Temp. (° C.) | Firing condition Time. (hr) | Porosity (%) | Thermal conductivity (W/mk) | Flexural strength (MPa) | Dielectric constant | Precipitated crystal phase 1) | Aspect ratio 2) |
|---|---|---|---|---|---|---|---|---|---|---|---|---|
| 1 | F | 85 | Al$_2$O$_3$ | 15 | 800 | 1 | <0.05 | 2.5 | 310 | 8 | BAS>A>Ga>YZ | 8 |
| 2 | F | 75 | Al$_2$O$_3$ | 25 | 850 | 1 | <0.05 | 3.1 | 370 | 7.8 | BAS>A>Ga>YZ | >10 |
| 3 | F | 50 | Al$_2$O$_3$ | 50 | 900 | 1 | <0.05 | 4.0 | 440 | 8.1 | BAS>A>Ga>YZ | >10 |
| 4 | F | 40 | Al$_2$O$_3$ CaSiO$_3$ | 55 5 | 950 | 1 | 0.15 | 3.7 | 390 | 7.5 | BAS>A>Ga>YZ | >10 |
| 5 | G | 95 | Al$_2$O$_3$ | 5 | 850 | 1 | <0.05 | 2.0 | 280 | 8 | BAS>A>Ga(Mg)>YZ | 6 |
| 6 | G | 75 | Al$_2$O$_3$ | 25 | 900 | 1 | <0.05 | 3.3 | 330 | 8.1 | BAS>A>Ga(Mg)>YZ | >10 |
| 7 | G | 55 | Al$_2$O$_3$ | 45 | 950 | 1 | <0.05 | 3.8 | 420 | 6 | BAS>A>Ga(Mg)>YZ | >10 |
| 8 | G | 45 | Al$_2$O$_3$ CaSiO$_3$ | 50 5 | 950 | 3 | 0.2 | 3.5 | 350 | 6.1 | BAS>A>Ga(Mg)>YZ | >10 |

1) BAS: BaAl$_2$Si$_2$O$_8$, A: Al$_2$O$_3$, Ga: ZnAl$_2$O$_4$, SAS: SrAl$_2$Si$_2$O$_8$, Z: ZrO$_2$, YZ: Y$_6$ZrO$_{11}$ Ga(Mg): (Zn,Mg)Al$_2$O$_4$ or MgAl$_2$O$_4$
2) Aspect ratio of BaAl$_2$Si$_2$O$_8$ crystal phase (BAS)

As will be obvious from the results of Table 3, the samples Nos. 1 to 8 in which the gahnite crystal phase (crystal phase (i)), the needle-like celsian crystal phase (crystal phase (ii)), the particular ceramic crystal phase (crystal phase (iii)) and the Y-containing crystal phase (crystal phase (iv)) are precipitated, exhibited the thermal conductivities of not smaller than 2 W/mK and the flexural strengths of not smaller than 280 MPa.

(Experiment 4)

An acrylic binder, a plasticizer and toluene were added and mixed to the starting powder of the sample No. 1 of Experiment 3, and a green sheet having a thickness of 250 μm was obtained by the doctor blade method. Then, via-holes were formed in the green sheet at predetermined positions and were filled with an electrically conducting paste comprising copper as a chief component, and a wiring layer was formed on the surface of the green sheet by the screen printing method by using the above electrically conducting paste.

Four pieces of the green sheets on which the wiring patterns have been formed were placed in position, laminated one upon the other and were thermally adhered together with pressure. The laminate was subjected to the binder-removing treatment in water vapor-containing nitrogen at 700° C., heated at a rate of 200° C./hour, and was fired in nitrogen at 800° C. for one hour to prepare a multi-layer wiring board having wiring layers composed chiefly of copper.

The wiring layers of the obtained wiring board were confirmed to contain no breaking portion, and favorable conduction properties were exhibited with low resistance.

What is claimed is:

1. A glass ceramic sintered product obtained by firing a molded article of a mixed powder of a glass powder and a ceramic powder, wherein the glass ceramic sintered product contains as crystal phases:

(i) a gahnite crystal phase;
   (ii) a celsian crystal phase containing needle-like crystals having an aspect ratio of not smaller than 3; and
   (iii) at least one crystal phase selected from the group consisting of AlN, $Si_3N_4$, SiC, $Al_2O_3$, $ZrO_2$, $3Al_2O_3 \cdot 2SiO_2$ and $Mg_2SiO_4$;

and has an open porosity of not larger than 0.3%.

2. A glass ceramic sintered product according to claim 1, wherein said crystal phases (i) and (ii) are precipitated from the glass.

3. A glass ceramic sintered product according to claim 1, having a content of PbO and a content of $A_2O$ (A: alkali metal) not larger than 1% by weight, respectively.

4. A glass ceramic sintered product according to claim 1, wherein the glass ceramic sintered product has a thermal conductivity of not smaller than 2 W/mK.

5. A glass ceramic sintered product according to claim 1, wherein the glass ceramic sintered product has a flexural strength of not smaller than 280 MPa.

6. A glass ceramic sintered product according to claim 1, wherein the glass ceramic sintered product has a Young's modulus of not smaller than 100 GPa.

7. A glass ceramic sintered product according to claim 1, wherein the celsian crystal phase (ii) contains hexagonal crystals and exhibits an X-ray diffraction pattern in which a main peak intensity ratio expressed by the following formula:

$$Ihex/Imon$$

wherein Ihex is the intensity of a main peak of the hexagonal crystals and Imon is the intensity of a main peak of monoclinic crystals, is not smaller than 3 in the X-ray diffraction measurement.

8. A glass ceramic sintered product according to claim 1, wherein the glass ceramic sintered product has a fracture toughness of not smaller than 1.5 $MPa \cdot m^{1/2}$.

9. A glass ceramic sintered product according to claim 1, wherein the glass ceramic sintered product has an electrically conducting layer containing at least one element selected from the group consisting of Cu, Ag, Au and Al on the surfaces thereof and/or in the inside thereof.

10. A glass ceramic sintered product according to claim 9, wherein the electrically conducting layer is formed by co-firing the molded article composed of said mixed powder.

11. A glass ceramic sintered product according to claim 9, wherein the electrically conducting layer is formed on the surface of the sintered product by a thin-film forming method.

12. A glass ceramic sintered product according to claim 1, wherein the surface roughness (Ra) on the fired surface is not larger than 1 μm.

13. A glass ceramic sintered product according to claim 1, wherein a glass ceramic sintered product further contains a Y (yttrium)-containing crystal phase (iv).

14. A glass ceramic sintered product according to claim 13, wherein the Y (yttrium)-containing crystal phase (iv) is at least one selected from the group consisting of $YAlO_3$, $Y_4Al_2O_9$, $BaY_2O_4$, $Ba_4Y_2O_7$, $Y_4Zr_3O_{12}$ and $Y_6ZrO_{11}$.

15. A glass ceramic sintered product according to claim 12, wherein the Y (yttrium)-containing crystal phase is precipitated from the glass.

16. A glass ceramic sintered product according to claim 1, having a amorphous phase in an amount of not larger than 50% by weight.

17. A glass ceramic sintered product according to claim 16, wherein the amorphous phase contains Y (yttrium).

18., A glass ceramic sintered product according to claim 1, wherein an amorphous phase is not substantially contained.

19. A glass ceramic sintered product according to claim 1, wherein the gahnite crystal phase contains $MgAl_2O_4$ as a solid solution.

20. A glass ceramic sintered product according to claim 1, wherein Zn in the gahnite crystal phase is substituted by Mg.

* * * * *